US012564100B2

(12) United States Patent　　　(10) Patent No.:　　US 12,564,100 B2

Mori et al.　　　　　　　　　　　　(45) Date of Patent:　　　Feb. 24, 2026

(54) SEMICONDUCTOR DEVICE AND CIRCUIT DEVICE

(71) Applicant: RENESAS ELECTRONICS CORPORATION, Tokyo (JP)

(72) Inventors: Kazuhisa Mori, Tokyo (JP); Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 606 days.

(21) Appl. No.: 18/059,615

(22) Filed: Nov. 29, 2022

(65) Prior Publication Data

US 2023/0291401 A1　　Sep. 14, 2023

(30) Foreign Application Priority Data

Feb. 3, 2022　(JP) ................................. 2022-015406

(51) Int. Cl.
　　*H01L 25/07*　　　　(2006.01)
　　*H02J 7/00*　　　　(2006.01)
　　　　　　(Continued)

(52) U.S. Cl.
　　CPC ............ *H01L 25/074* (2013.01); *H01L 25/07* (2013.01); *H02J 7/0063* (2013.01);
　　　　　　(Continued)

(58) Field of Classification Search
　　CPC ..... H01L 25/074; H01L 25/07; H10D 12/481; H10D 30/668; H10D 62/127; H10D 62/393
　　See application file for complete search history.

(56) References Cited

U.S. PATENT DOCUMENTS 10,083,884 B2 *　9/2018　Cho ........................ H01L 25/18
10,250,255 B2　　4/2019　Yanagigawa
　　　　　　(Continued)

FOREIGN PATENT DOCUMENTS

JP　　2016-207716 A　　12/2016
JP　　2019-145547 A　　8/2019
JP　　2012-243930 A　　12/2021

OTHER PUBLICATIONS

Office Action dated Jun. 3, 2025, issued in corresponding Japan Application No. 2022-015406, 13 pages.

*Primary Examiner* — Joseph C. Nicely
(74) *Attorney, Agent, or Firm* — Rimon P.C.

(57)　　　　　　ABSTRACT

Performance of a semiconductor device is enhanced. A loss of a circuit device using a semiconductor device as a switch is reduced. A semiconductor device includes: a first semiconductor chip having a first MOSFET of p-type and a first parasitic diode; and a second semiconductor chip having a second MOSFET of n-type and a second parasitic diode. On front surfaces of the first and second semiconductor chips, a first source electrode and a first gate wiring and a second source electrode and a second gate wiring are formed, respectively. On back surfaces of the first and second semiconductor chips, first and second drain electrodes are formed, respectively. The second back surface and the first front surface face each other such that the second drain electrode and the first source electrode come into contact with each other via a conductive paste.

6 Claims, 9 Drawing Sheets

(51) Int. Cl.

| | |
|---|---|
| *H03K 17/687* | (2006.01) |
| *H10D 12/00* | (2025.01) |
| *H10D 30/66* | (2025.01) |
| *H10D 62/10* | (2025.01) |
| *H10D 62/17* | (2025.01) |
| *H01L 23/00* | (2006.01) |
| *H01L 23/498* | (2006.01) |

(52) U.S. Cl.

CPC ....... *H03K 17/6871* (2013.01); *H10D 12/481* (2025.01); *H10D 30/668* (2025.01); *H10D 62/127* (2025.01); *H10D 62/393* (2025.01); *H01L 23/49811* (2013.01); *H01L 24/13* (2013.01); *H01L 24/48* (2013.01); *H01L 2224/73265* (2013.01); *H01L 2924/1811* (2013.01); *H01L 2924/182* (2013.01)

(56) References Cited

U.S. PATENT DOCUMENTS

| | | | |
|---|---|---|---|
| 2014/0061884 A1* | 3/2014 | Carpenter | H01L 23/49575 |
| | | | 257/676 |
| 2015/0206830 A1* | 7/2015 | Takada | H01L 21/561 |
| | | | 257/676 |
| 2017/0141018 A1* | 5/2017 | Kawano | H01L 25/16 |
| 2017/0194688 A1* | 7/2017 | Sharma | H01P 1/18 |
| 2019/0214496 A1* | 7/2019 | Arai | H10D 30/60 |
| 2019/0259758 A1* | 8/2019 | Iwamizu | H10D 64/23 |
| 2023/0246002 A1* | 8/2023 | Nakashiba | H01L 25/074 |
| | | | 257/334 |

* cited by examiner

CHP1
(TS1)

1Q

SE1

GW1
(GE1)

CHP2
(TS2)

2Q

GW2
(GE2)

SE2

A-A CROSS-SECTION

B-B CROSS-SECTION

A–A CROSS-SECTION

B–B CROSS-SECTION

\<STUDIED EXAMPLE\>

\<STUDIED EXAMPLE\>

*FIG. 13*

| | FIRST EMBODIMENT | STUDIED EXAMPLE |
|---|---|---|
| 1Q ON-RESISTANCE | 1.1 | 1.0 |
| 2Q ON-RESISTANCE | 0.6 | 0.6 |
| RESISTANCE OF EXTERNAL CONNECTION TERMINAL | 0.6/3 | 2*0.6 |
| RESISTANCE OF LEAD FRAME | 0.2 | 0.6 |
| TOTAL | 2.1 | 3.4 |

SEMICONDUCTOR DEVICE AND CIRCUIT DEVICE

CROSS-REFERENCE TO RELATED APPLICATIONS

The disclosure of Japanese Patent Application No. 2022-015406 filed on Feb. 3, 2022 including the specification, drawings and abstract is incorporated herein by reference in its entirety.

BACKGROUND

The present invention relates to a semiconductor device and a circuit device, and particularly relates to a semiconductor device including an n-type metal oxide semiconductor field effect transistor (MOSFET), and to a circuit device using the semiconductor device.

On an automobile, there are mounted a large number of electrical appliances which require electrical power, for example, such as headlamps and power windows. Heretofore, relays have been used as switches for supplying electrical power, which is output from a battery, to these electrical appliances, or for shutting off the electrical power therefrom. In recent years, a semiconductor device including an n-type power MOSFET has been used in place of such a relay.

At the time of maintaining the battery, cables connected to the battery are sometimes detached, and when the battery is finished being maintained, the cables are reconnected to the battery. Then in some cases, there occurs such a malfunction that the cables are connected in reverse to a positive electrode and negative electrode of the battery. In a switch using the relay, if the switch is left in an OFF state, a current does not flow even if the cables are connected in reverse.

However, in a switch using the semiconductor device, even if the power MOSFET is turned to the OFF state, a current flows via a parasitic diode formed in the power MOSFET. In order to prevent such a backflow of the current, a p-type power MOSFET is connected in series between a drain of the n-type power MOSFET and the positive electrode of the battery.

In that case, for the form of the semiconductor device (a semiconductor module), a method is conceivable, which is of preparing, as separate packages, a semiconductor chip including the n-type power MOSFET and a semiconductor chip including the p-type power MOSFET (a first case example). Alternatively, a method is conceivable, which is of laying flat the semiconductor chip including the n-type power MOSFET and the semiconductor chip including the p-type power MOSFET, and preparing these as one package (a second case example). However, the first case example has a problem that an implementation area of the semiconductor module increases, and the second case example has a problem that the area of the package increases.

There are disclosed techniques listed below.

[Patent Document 1] Japanese Unexamined Patent Application Publication No. 2016-207716

[Patent Document 2] Japanese Unexamined Patent Application Publication No. 2012-243930

In Patent Document 1, in order to prevent the backflow of the current, an n-type power MOSFET connected in series while reversing orientations of source/drain thereof is used in place of the p-type power MOSFET. Patent Document 1 discloses a semiconductor device (a third case example) in which two n-type power MOSFETs are formed on the same semiconductor substrate and are prepared as one package. A source of one of the n-type power MOSFETs is connected to a positive electrode of a battery, a drain of the one of the n-type power MOSFETS is connected to a drain of the other n-type power MOSFET, and a source of the other n-type power MOSFET is connected to a negative electrode of the battery.

Moreover, Patent Document 2 discloses a semiconductor device in which an n-type power MOSFET of a trench gate type and an n-type MOSFET of a planar type are formed on the same semiconductor substrate.

SUMMARY

In the semiconductor device (the third case example) of Patent Document 1, in comparison with the first case example and the second case example, it becomes possible to reduce the implementation area and the area of the package.

However, the drains of the two n-type power MOSFETS connected to each other are electrically connected to each other via an n-type drift region in the semiconductor substrate, a drain electrode formed on a back surface side of the semiconductor substrate, and a lead frame formed under the drain electrode. That is, since a resistance component between the two n-type power MOSFETS in a transverse direction increases, there is a problem that it is difficult to enhance performance of the semiconductor device. Accordingly, in the case of using the semiconductor device as a switch, there is a problem that it is difficult to reduce a loss of the switch.

It is a main object of the present application to reduce the mounting area and the area of the package in comparison with the first case example and the second case example, and to reduce the resistance component and enhance the performance of the semiconductor device in comparison with the third case example. Thus, a loss of a circuit device using the semiconductor device as a switch is reduced.

Other objects and novel features will be apparent from the description in the specification and the accompanying drawings.

Outlines of representatives in embodiments disclosed in the present application will be briefly described below.

A semiconductor device as an embodiment includes: a first semiconductor chip having a first MOSFET of p-type and a first parasitic diode formed in the first MOSFET; and a second semiconductor chip having a second MOSFET of n-type and a second parasitic diode formed in the second MOSFET. Herein, a first source electrode and a first gate wiring are formed on a front surface of the first semiconductor chip, a first drain electrode is formed on a back surface of the first semiconductor chip, a first anode of the first parasitic diode is coupled to the first drain electrode, and a first cathode of the first parasitic diode is coupled the first source electrode, a second source electrode and a second gate wiring are formed on a front surface of the second semiconductor chip, a second drain electrode is formed on a back surface of the second semiconductor chip, a second anode of the second parasitic diode is coupled to the second source electrode, and a second cathode of the second parasitic diode is coupled to the second drain electrode, and the back surface of the second semiconductor chip and the front surface of the first semiconductor chip face each other such that the second drain electrode and the first source electrode come into contact with each other via a conductive member.

In accordance with the embodiment, the performance of the semiconductor device can be enhanced. Moreover, the loss of the circuit device using the semiconductor device as a switch can be reduced.

BRIEF DESCRIPTION OF THE DRAWINGS

FIG. 13 is a table in which resistance values of the first embodiment and resistance values of the studied example are compared with each other.

DETAILED DESCRIPTION

Figure 1:
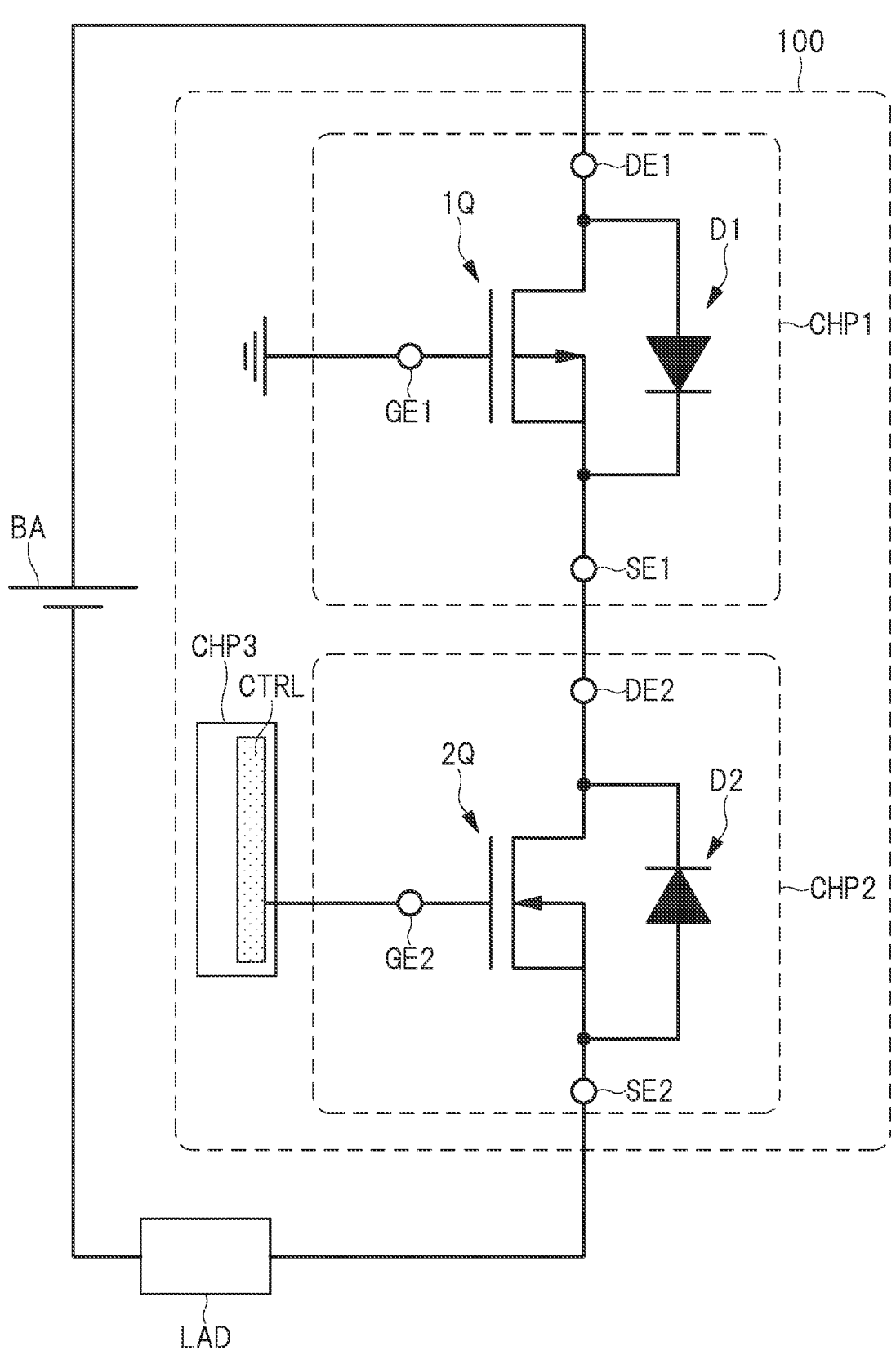
FIG. 1 is an equivalent circuit diagram showing a circuit device using semiconductor devices in a first embodiment.

Hereinafter, embodiments will be described in detail with reference to the drawings. Note that, in all the drawings for describing the embodiments, the same reference numerals are assigned to members having the same functions, and repeated descriptions thereof will be omitted. Moreover, in the following embodiments, unless particularly necessary, the description of the same or similar portions will not be repeated in principle.

First Embodiment

<Circuit Device Using Semiconductor Device>

FIG. 1 shows a circuit device using, as a switch, a semiconductor device 100 in a first embodiment. The semiconductor device 100 is a semiconductor module, and includes: a semiconductor chip CHP1 including a MOSFET 1Q of p-type and a parasitic diode D1; and a semiconductor chip CHP2 including a MOSFET 2Q of n-type and a parasitic diode D2. Moreover, in some cases, the semiconductor device 100 includes a semiconductor chip CHP3 including a control circuit CTRL.

The circuit device in FIG. 1 includes the semiconductor device 100 to be used as a switch, a battery BA, and a load LAD. The load LAD is an electrical appliance mounted on an automobile, for example, such as a headlamp and a power window.

A drain electrode DE1 of the MOSFET 1Q is electrically connected to a positive electrode of the battery BA. A source electrode SE1 of the MOSFET 1Q is electrically connected to a drain electrode DE2 of a MOSFET 2Q. A source electrode SE2 of the MOSFET 2Q is electrically connected to a negative electrode of the battery BA via the load LAD. A gate electrode GE1 of the MOSFET 1Q is electrically fixed to a ground potential (GND). A gate electrode GE2 of the MOSFET 2Q is electrically connected to the control circuit CTRL.

Note that the control circuit CTRL has a function to supply a gate potential to the gate electrode GE2 in order to switch the MOSFET 2Q between an ON state and an OFF state. Moreover, the control circuit CTRL sometimes includes, as a circuit that has another function, a booster circuit, a thermal shutdown control circuit, an overcurrent limiting circuit, a monitor circuit that senses a current, a voltage and the like, or the like.

The parasitic diode D1 is formed in the MOSFET 1Q. As shown in FIG. 1, an anode of this parasitic diode D1 is coupled to the drain electrode DE1. Moreover, as shown in FIG. 1, a cathode of this parasitic diode D1 is coupled to the source electrode SE1.

The parasitic diode D2 is formed in the MOSFET 2Q. As shown in FIG. 1, an anode of this parasitic diode D2 is coupled to the source electrode SE2. Moreover, as shown in FIG. 1, a cathode of this parasitic diode D2 is coupled to the drain electrode DE2.

The MOSFET 2Q is a device for performing switching operations (an ON operation and an OFF operation) for supplying electrical power to the load LAD according to needs when the battery BA is appropriately coupled to the semiconductor device 100. The MOSFET 1Q is a device for preventing a backflow of a current when the battery BA is connected in reverse to the semiconductor device 100.

A description will be given of a circuit operation when the battery BA is appropriately coupled to the semiconductor device 100. First, a description will be given of the case of supplying electrical power from the battery BA to the load LAD. The gate electrode GE1 of the MOSFET 1Q is fixed to the ground potential, and is in a low potential state with respect to the source electrode SE1, and accordingly, the MOSFET 1Q is in the ON state. A gate potential equal to or more than a threshold voltage of the MOSFET 2Q is supplied from the control circuit CTRL to the gate electrode GE2, whereby the MOSFET 2Q is turned to the ON state. Thus, a current flows from the battery BA to the load LAD.

A description will be given of the case of shutting off the electrical power supplied to the load LAD. The gate electrode GE1 of the MOSFET 1Q is fixed to the ground potential, and is in such a low potential state with respect to the source electrode SE1, and accordingly, the MOSFET 1Q is in the ON state. For example, the ground potential (GND) is supplied from the control circuit CTRL to the gate electrode GE2, whereby the MOSFET 2Q is turned to the OFF state. Thus, a current does not flow from the battery BA to the load LAD.

Next, a description will be given of a circuit operation when the battery BA is connected in reverse to the semiconductor device 100. When the battery BA is connected in reverse to the semiconductor device 100, the gate electrode GE1 of the MOSFET 1Q, which has been fixed to the ground potential (GND), is fixed to a positive electrode potential of the battery BA (which is a highest potential in the circuit), and turns to a high potential state with respect to the source electrode SE1, and accordingly, the MOSFET 1Q turns to the OFF state. Moreover, no current flows to the parasitic diode D1, either. Thus, a current can be prevented from flowing from the battery BA to the load LAD.

<Structures of MOSFET and Parasitic Diode>

Figure 2:
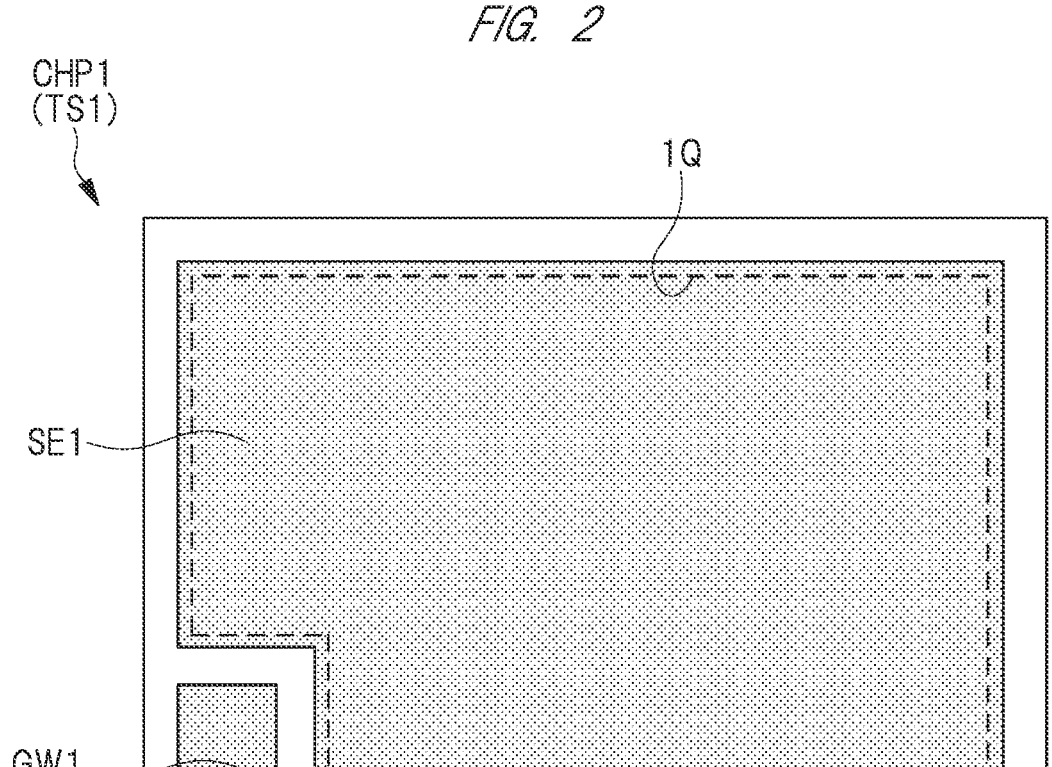
FIG. 2 is a plan view showing one of two semiconductor chips in the first embodiment.
Figure 3:
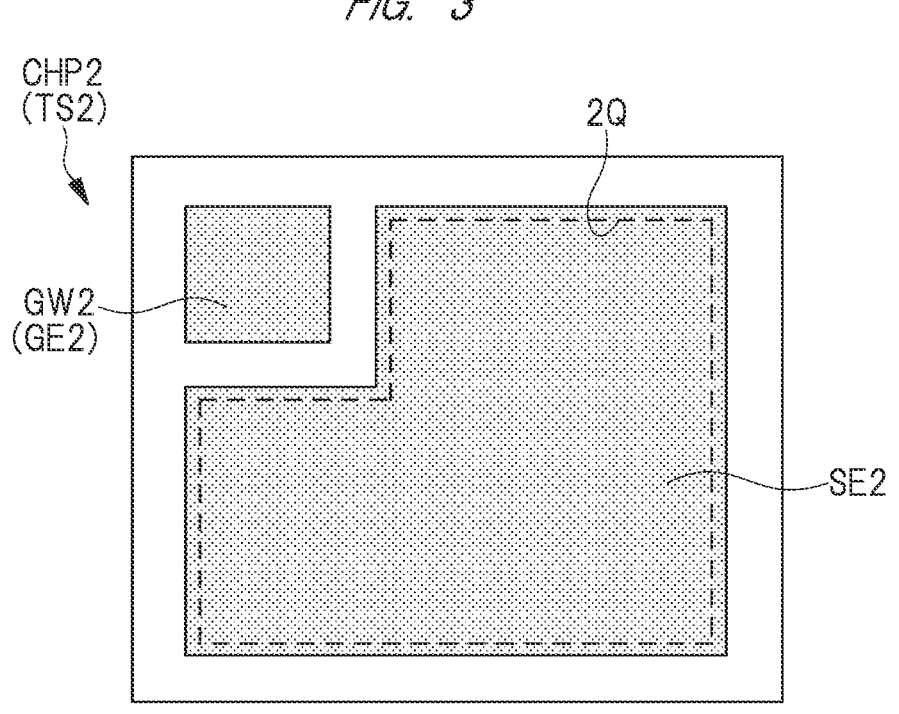
FIG. 3 is a plan view showing the other semiconductor chip in the first embodiment.

The semiconductor chip CHP1 has a front surface TS1 and a back surface BS1, and the semiconductor chip CHP2 has a front surface TS2 and a back surface BS2. FIG. 2 is a plan view of the semiconductor chip CHP1 when viewed from the front surface TS1 side. FIG. 3 is a plan view of the semiconductor chip CHP2 when viewed from the front surface TS2 side. Note that a plane area of the semiconductor chip CHP1 is larger than a plane area of the semiconductor chip CHP2.

As shown in FIG. 2, the source electrode SE1 and a gate wiring GW1 are formed on the front surface TS1 of the semiconductor chip CHP1. Most of the semiconductor chip CHP1 is covered with the source electrode SE1, and the MOSFET 1Q is mainly formed below the source electrode SE1. Moreover, the gate electrode GE1 of the MOSFET 1Q is electrically connected to the gate wiring GW1.

As shown in FIG. 3, the source electrode SE2 and a gate wiring GW2 are formed on the front surface TS2 of the semiconductor chip CHP2. Most of the semiconductor chip CHP2 is covered with the source electrode SE2, and the MOSFET 2Q is mainly formed below the source electrode SE2. Moreover, the gate electrode GE2 of the MOSFET 2Q is electrically connected to the gate wiring GW2.

Figure 4:
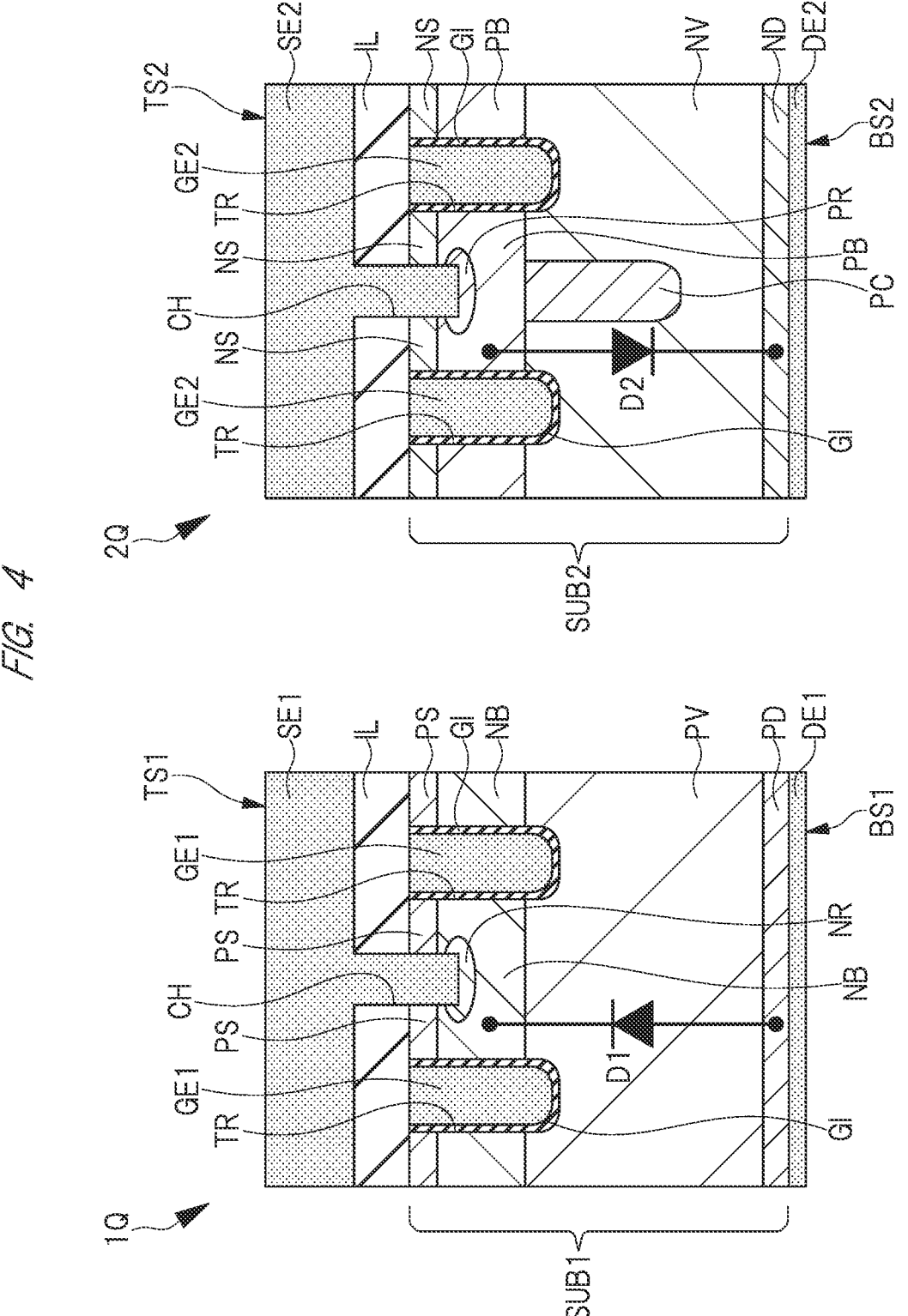
FIG. 4 is a cross-sectional view showing two MOSFETS formed in the two semiconductor chips in the first embodiment, and two parasitic diodes formed therein.

Referring to FIG. 4, a description will be given below of structures of the MOSFET 10, the parasitic diode D1, the MOSFET 2Q and the parasitic diode D2. Note that a plurality of MOSFETs is actually formed on each of the semiconductor chips CHP1 and CHP2, and these are connected in parallel to one another. Hence, in terms of an equivalent circuit, the above-described plurality of MOSFETs can be regarded as one MOSFET. Each of the MOSFETs 1Q and 20 described in the present application is made as one MOSFET by aggregating the above-described plurality of MOSFETs coupled in parallel to one another.

First, the structures of the MOSFET 1Q and the parasitic diode D1 will be described.

A semiconductor substrate SUB1 has a front surface and a back surface, and has a drift region PV of p-type of low concentration. Herein, the semiconductor substrate SUB1 is a p-type silicon substrate, and the semiconductor substrate SUB1 itself constitutes the drift region PV. Note that the drift region PV may be a laminate of a p-type silicon substrate and a semiconductor layer grown while introducing boron (B) onto the silicon substrate by epitaxial growth. The present application will be described on the premise that such a laminate is also the semiconductor substrate SUB1.

On a front surface side of the semiconductor substrate SUB1, a body region NB of n-type is formed in the semiconductor substrate SUB1. A source region PS of p-type is formed in the body region NB. The source region PS has an impurity concentration higher than the drift region PV.

On the front surface side of the semiconductor substrate SUB1, trenches TR are formed in the semiconductor substrate SUB1. Bottoms of the trenches TR reach positions deeper than the body region NB. Gate insulating films GI are formed inside the trenches TR. The gate electrodes GEL are formed on the gate insulating films GI so as to fill the insides of the trenches TR. That is, the MOSFET 1Q forms a trench gate-type structure. The gate insulating films GI are, for example, silicon oxide films, and the gate electrodes GE1 are, for example, p-type polycrystalline silicon films.

On the front surface of the semiconductor substrate SUB1, an interlayer insulating film IL is formed so as to cover the gate electrodes GE1. The interlayer insulating film IL is, for example, a silicon oxide film. A hole CH is formed in the interlayer insulating film IL. The hole CH penetrate the interlayer insulating film IL and the source region PS so that a bottom thereof is located in the body region NB. Moreover, on the bottom of the hole CH, a high-concentration region NR of n-type is formed in the body region NB. The high-concentration region NR has a higher impurity concentration than the body region NB.

On the interlayer insulating film IL, the source electrode SE1 is formed so as to fill the inside of the hole CH. The source electrode SE1 is electrically connected to the source region PS, the body region NB and the high-concentration region NR, and supplies a source potential to these. Note that, though not shown herein, the gate wiring GW1 is also formed on the interlayer insulating film IL. A plurality of the gate electrodes GE1 is collectively connected to a gate extracting portion on an outer peripheral portion of the semiconductor chip CHP1. The hole CH is also formed on the gate extracting portion, and the gate wiring GW1 is embedded into the inside of the hole CH. Therefore, the gate wiring GW1 is electrically connected to the gate electrodes GE1, and supplies the gate potential to the gate electrodes GE1.

Each of the source electrode SE1 and the gate wiring GW1 is composed, for example, of a barrier metal film and a conductive film formed on the above-described barrier metal film. The above-described barrier metal film is, for example, a titanium nitride film, and the above-described conductive film is, for example, an aluminum film.

Note that each of the source electrode SE1 and the gate wiring GW1 may be composed of a plug layer that fills the inside of the hole CH and of a wiring portion formed on the interlayer insulating film IL. In that case, the above-described wiring portion is a laminated film of the titanium nitride film and the aluminum film, which are mentioned above, and the above-described plug layer is a laminated film of a barrier metal film such as a titanium nitride film and a conductive film such as a tungsten film.

On a back surface side of the semiconductor substrate SUB1, a drain region PD of p-type is formed in the semiconductor substrate SUB1. The drain region PD has an impurity concentration higher than the drift region PV. On the back surface of the semiconductor substrate SUB1, the drain electrode DE1 is formed. The drain electrode DE1 is electrically connected to the drain region PD and the drift region PV, and supplies a drain potential to the drain region PD. The drain electrode DE1 is composed, for example, of a single metal film such as an aluminum film, a titanium film, a nickel film, a gold film, and a silver film, or of a laminated film formed by appropriately laminating these metal films on one another.

The parasitic diode D1 is comprised of the body region NB, and the semiconductor substrate SUB1 (the drift region PV) and the drain region PD, which are located below the body region NB. That is, the parasitic diode D1 is a PN diode, in which, in the semiconductor chip CHP1, an anode is the semiconductor substrate SUB1 and the drain region PD, and a cathode is the body region NB.

Next, the structures of the MOSFET 2Q and the parasitic diode D2 will be described.

A semiconductor substrate SUB2 has a front surface and a back surface, and has a drift region NV of n-type of low concentration. Herein, the semiconductor substrate SUB2 is an n-type silicon substrate, and the semiconductor substrate SUB2 itself constitutes the drift region NV. Note that the drift region NV may be a laminate of an n-type silicon substrate and a semiconductor layer grown while introducing phosphorus (P) onto the silicon substrate by epitaxial growth. The present application will be described on the premise that such a laminate is also the semiconductor substrate SUB2.

On a front surface side of the semiconductor substrate SUB2, a body region PB of p-type is formed in the semiconductor substrate SUB2. A source region NS of n-type is formed in the body region PB. The source region NS has an impurity concentration higher than the drift region NV.

On the front surface side of the semiconductor trenches TR are formed in the substrate SUB2, semiconductor substrate SUB2. Bottoms of the trenches TR reach positions deeper than the body region PB. Gate insulating films GI are formed insides the trenches TR. The gate electrodes GE2 are formed on the gate insulating films GI so as to fill the insides of the trenches TR. That is, the MOSFET 2Q forms a trench gate-type structure. The gate insulating films GI are, for example, silicon oxide films, and the gate electrodes GE2 are, for example, n-type polycrystalline silicon films.

On the front surface of the semiconductor substrate SUB2, an interlayer insulating film IL is formed so as to cover the gate electrodes GE2. The interlayer insulating film IL is, for example, a silicon oxide film. A hole CH is formed in the interlayer insulating film IL. The hole CH penetrate the interlayer insulating film IL and the source region NS so that a bottom thereof is located in the body region PB. Moreover, on the bottom of the hole CH, a high-concentration region PR of p-type is formed in the body region PB. The high-concentration region PR has a higher impurity concentration than the body region PB.

On the interlayer insulating film IL, the source electrode SE2 is formed so as to fill the inside of the hole CH. The source electrode SE2 is electrically connected to the source region NS, the body region PB and the high-concentration region PR, and supplies a source potential to these. Note that, though not shown herein, the gate wiring GW2 is also formed on the interlayer insulating film IL. A plurality of the gate electrodes GE2 is collectively connected to a gate extracting portion on an outer peripheral portion of the semiconductor chip CHP2. The hole CH is also formed on the gate extracting portion, and the gate wiring GW2 is embedded into the inside of the hole CH. Therefore, the gate wiring GW2 is electrically connected to the gate electrodes GE2, and supplies the gate potential to the gate electrodes GE2.

On a back surface side of the semiconductor substrate SUB2, a drain region ND of n-type is formed in the semiconductor substrate SUB2. The drain region ND has an impurity concentration higher than the drift region NV. On the back surface of the semiconductor substrate SUB2, the drain electrode DE2 is formed. The drain electrode DE2 is electrically connected to the drain region ND and the drift region NV, and supplies a drain potential to the drain region ND.

Materials which constitute the source electrode SE2, the gate wiring GW2 and the drain electrode DE2 are the same as materials which constitute the source electrode SE1, the gate wiring GW1 and the drain electrode DE1, respectively.

The parasitic diode D2 is comprised of the body region PB, and the semiconductor substrate SUB2 (the drift region NV) and the drain region ND, which are located below the body region PB. That is, the parasitic diode D2 is a PN diode, in which, in the semiconductor chip CHP2, an anode is the body region PB, and a cathode is the semiconductor substrate SUB2 and the drain region ND.

Note that, in the MOSFET 2Q, a column region PC of p-type is formed in the semiconductor substrate SUB2 located below the body region PB. The column region PC has a higher impurity concentration than the body region PB. In the case of the MOSFET 2Q of n-type, such a column region PC of p-type is formed, whereby the periphery of the column region PC can be depleted, and a withstand voltage thereof can be enhanced.

Herein, since the column region PC is in contact with the body region PB, the source potential is also supplied to the column region PC of p-type. However, the column region PC may be physically separated from the body region PB, and may adopt a floating structure.

For the same purpose as that of the column region PC, an n-type column region may also be formed in the MOSFET 1Q; however, an ON-resistance increases when the column region is formed. The MOSFET 2Q is a main device that serves as a switch in the circuit device of FIG. 1. Therefore, it is preferable that the column region PC be formed in the MOSFET 2Q in order to ensure reliability of the switch when the battery BA is connected thereto. It is preferable that, in order to quickly supply electrical power to the load LAD, the column region should not be provided in the MOSFET 1Q to reduce the ON-resistance.

<Structure of Semiconductor Device>

Figure 5:
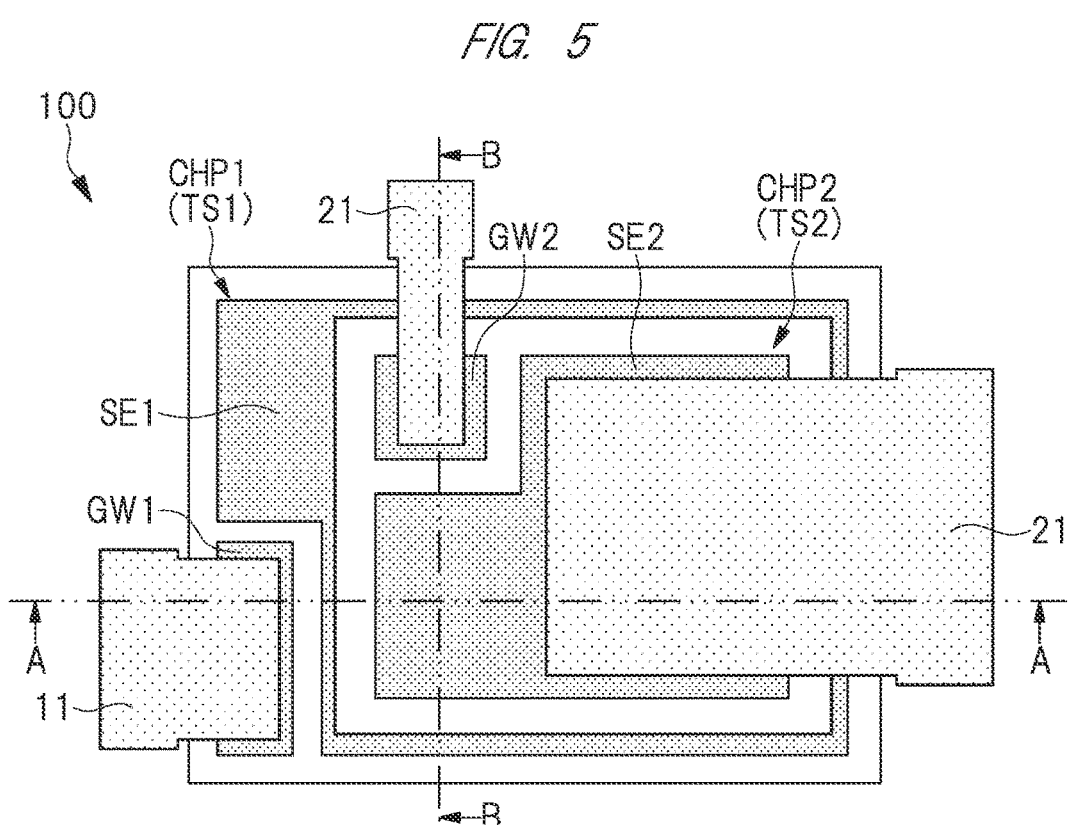
FIG. 5 is a plan view showing the semiconductor device in the first embodiment.
Figure 6:
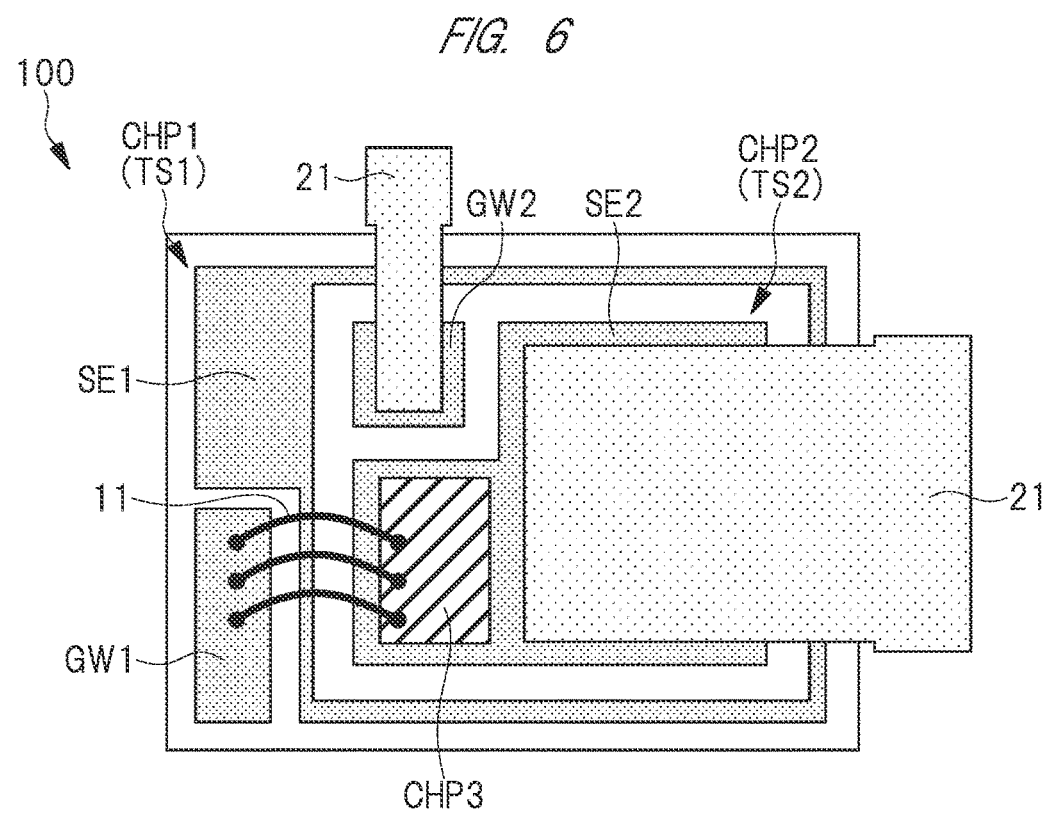
FIG. 6 is a plan view showing the semiconductor device in the first embodiment.
Figures 7, 8:
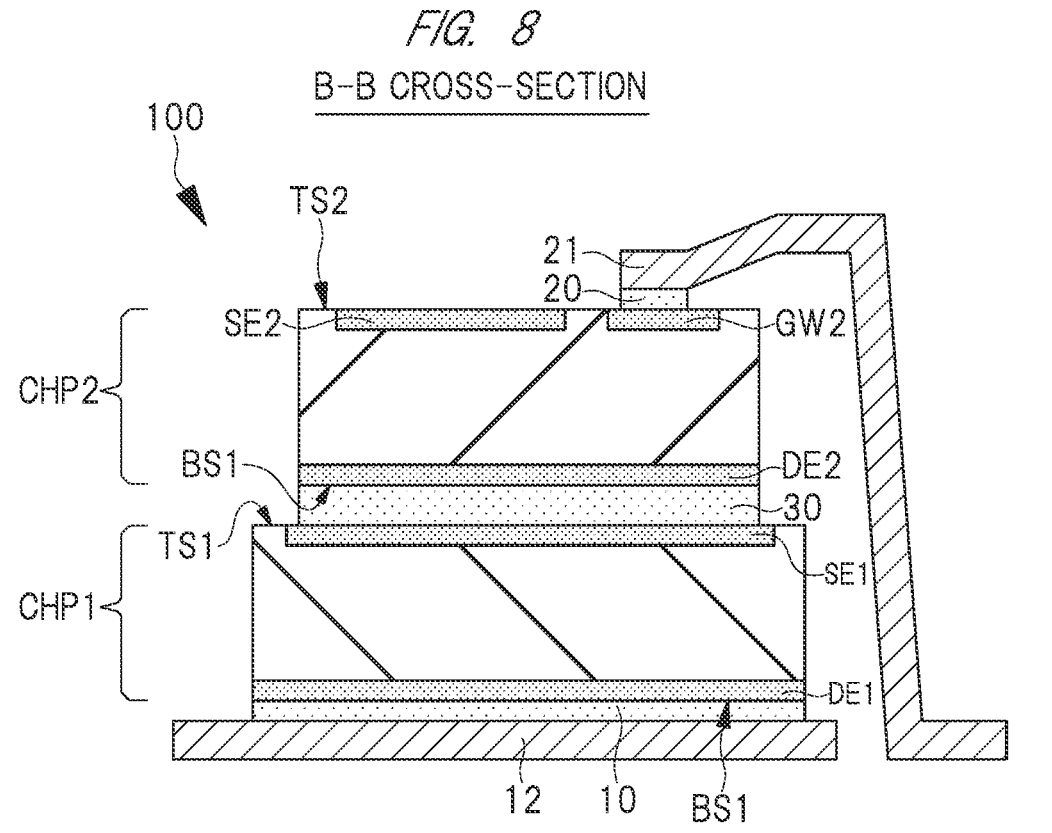
FIG. 7 is a cross-sectional view showing the semiconductor device in the first embodiment.
FIG. 8 is a cross-sectional view showing the semiconductor device in the first embodiment.

Referring to FIGS. 5 to 10, a structure of the semiconductor device 100 will be described below. FIG. 5 is a plan view showing the semiconductor device 100. FIG. 7 is a cross-sectional view taken along a line A-A in FIG. 5. FIG. 8 is a cross-sectional view taken along a line B-B in FIG. 5.

Note that FIG. 6 shows a state in the case where the semiconductor chip CHP3 including the control circuit CTRL is mounted on the semiconductor chip CHP1. The semiconductor chip CHP3 is provided on the source electrode SE2 with insulating resin interposed therebetween. In this case, though not shown, a pad electrode is provided as a part of the control circuit CTRL on a front surface of the semiconductor chip CHP3, and this pad electrode and the gate wiring GW1 are electrically connected to each other by external connection members 11 such as bonding wires. In FIGS. 7 and 8, the semiconductor chip CHP3 is not shown in order to simplify the explanation.

As shown in FIGS. 7 and 8, in the semiconductor device 100, the semiconductor chip CHP1 and the semiconductor chip CHP2 are laminated on each other. That is, the back surface BS2 of the semiconductor chip CHP2 and the front surface TS1 of the semiconductor chip CHP1 face each other so that the drain electrode DE2 and the source electrode SE1 can come into contact with each other with a conductive member interposed therebetween. The conductive member is a conductive paste 30 such as silver paste and solder. Note that, in terms of implementation easiness, it is superior to laminate the semiconductor chip CHP2 with a small plane area on the semiconductor chip CHP1 with a large plane area.

As shown in FIGS. 5 to 8, on the front surface TS1 side of the semiconductor chip CHP1, the gate wiring GW1 is connected to the external connection members 11 with conductive paste 10 interposed therebetween. On the back surface BS1 side of the semiconductor chip CHP1, the drain electrode DE1 is connected to a lead frame 12 with the conductive paste 10 interposed therebetween. On the front surface TS2 side of the semiconductor chip CHP2, the source electrode SE2 and the gate wiring GW2 are connected to external connection members 21 with conductive paste 20 interposed therebetween.

The conductive pastes 10 and 20 are, for example, silver pastes. The external connection members 11 and 21 are, for example, clips (copper plates) or bonding wires made of copper or aluminum. Herein, the case where the external connection members 11 and 21 are clips is illustrated, and the clips are processed so as to bend toward the back surface BS1 of the semiconductor chip CHP1.

Figure 9:
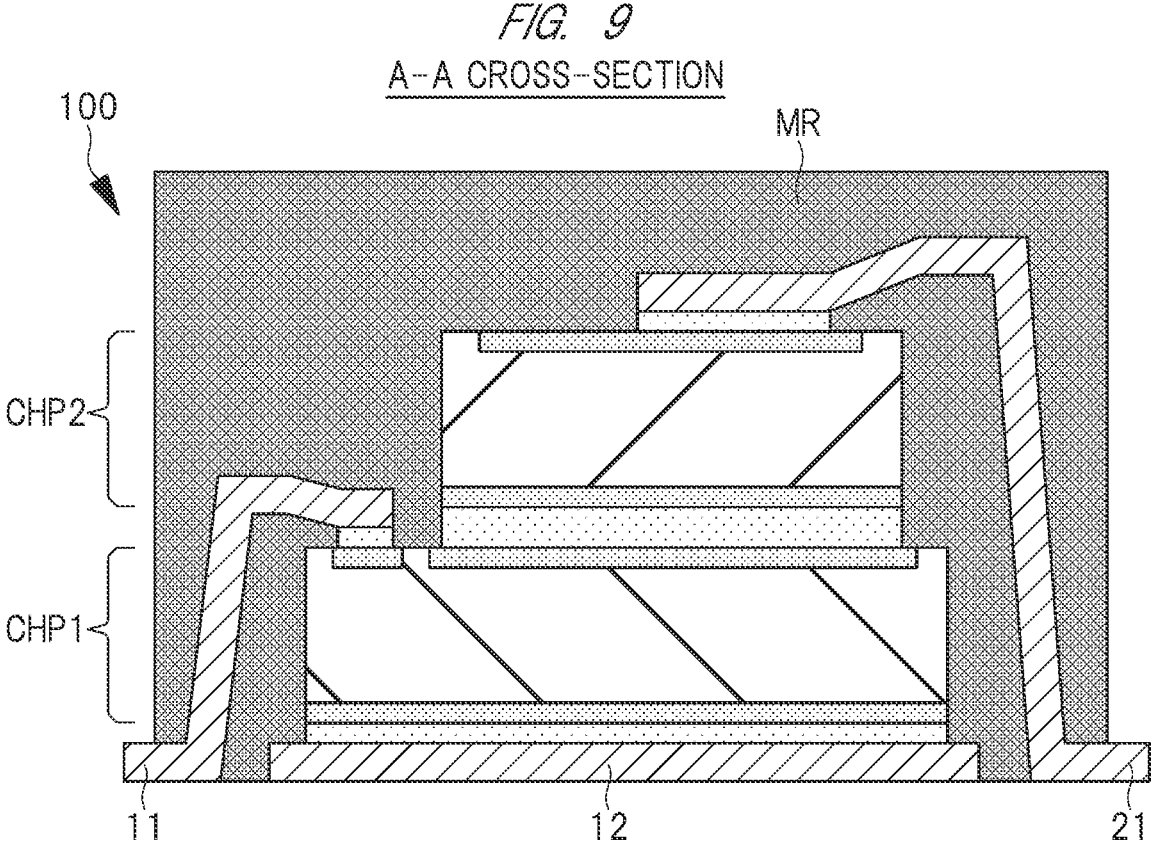
FIG. 9 is a cross-sectional view showing the semiconductor device in the first embodiment.
Figure 10:
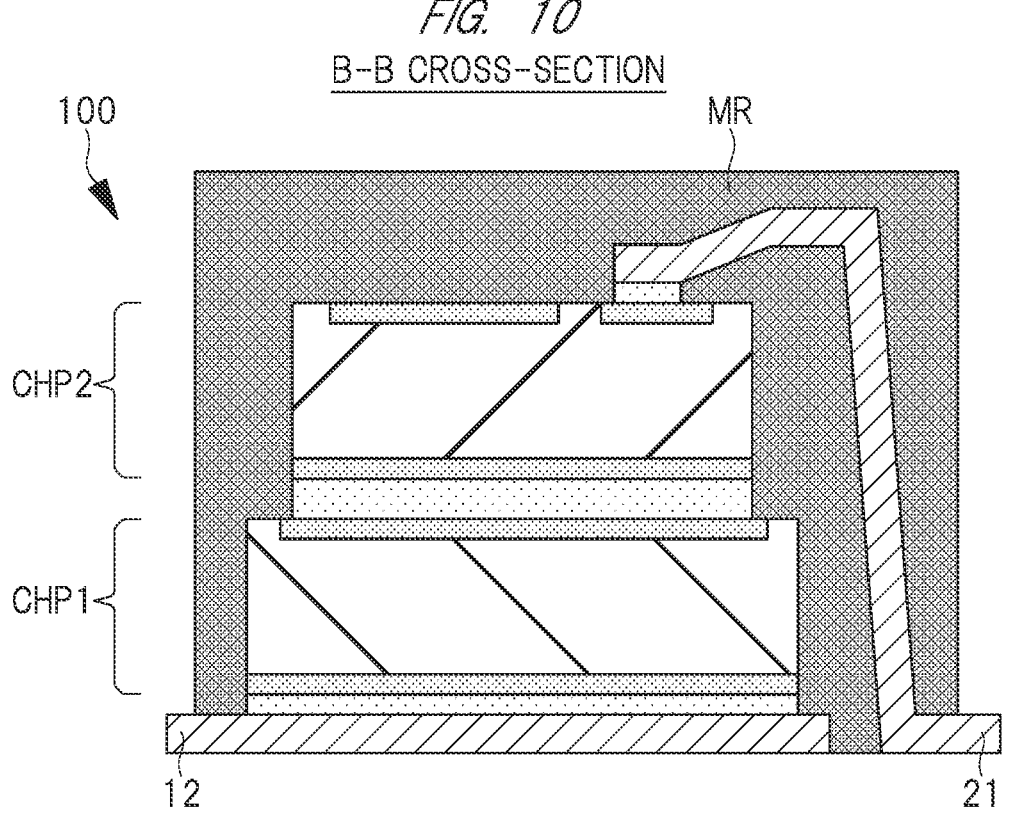
FIG. 10 is a cross-sectional view showing the semiconductor device in the first embodiment.

As shown in FIGS. 9 and 10, the semiconductor chip CHP1, the semiconductor chip CHP2, the conductive paste 30, the external connection members 11 and 21 and the lead frame 12 are sealed with sealing resin MR. The external connection members 11 and 21 and the lead frame 12 are partially exposed from the sealing resin MR. Thus, the MOSFETs 1Q and 20 can be electrically connected to other semiconductor chips, wiring boards or electronic instruments via such exposed parts of the external connection members 11 and 21 and the lead frame 12. That is, the switches composed of the MOSFETs 1Q and 20 can be electrically connected to such battery BA and load LAD as shown in FIG. 1.

Note that, when the semiconductor chip CHP3 is mounted as shown in FIG. 6, the semiconductor chip CHP3 is sealed with the sealing resin MR together with the semiconductor chips CHP1 and CHP2, whereby the semiconductor chips CHP1 to CHP3 can be provided as one package. Moreover, the semiconductor chip CHP3 and the semiconductor chips CHP1 and CHP2 may be packaged separately from each other.

<Comparison with Studied Example>

Figure 11:
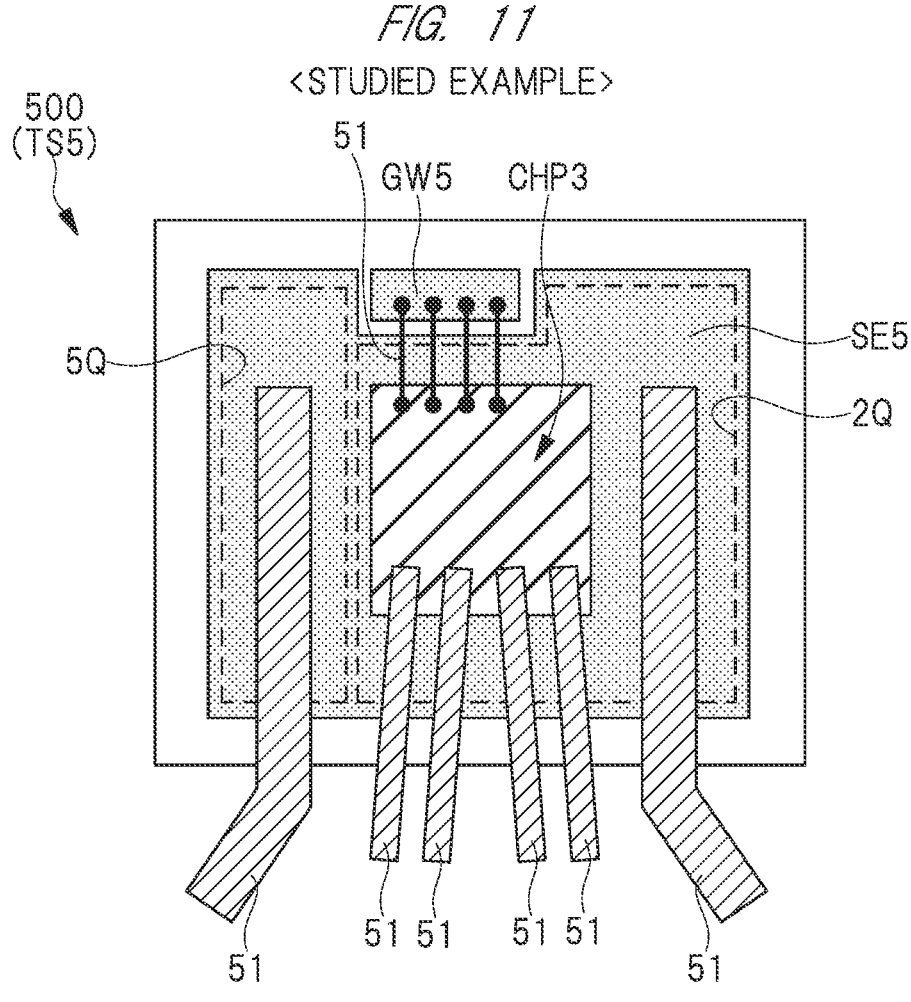
FIG. 11 is a plan view showing a semiconductor device in a studied example.
Figure 12:
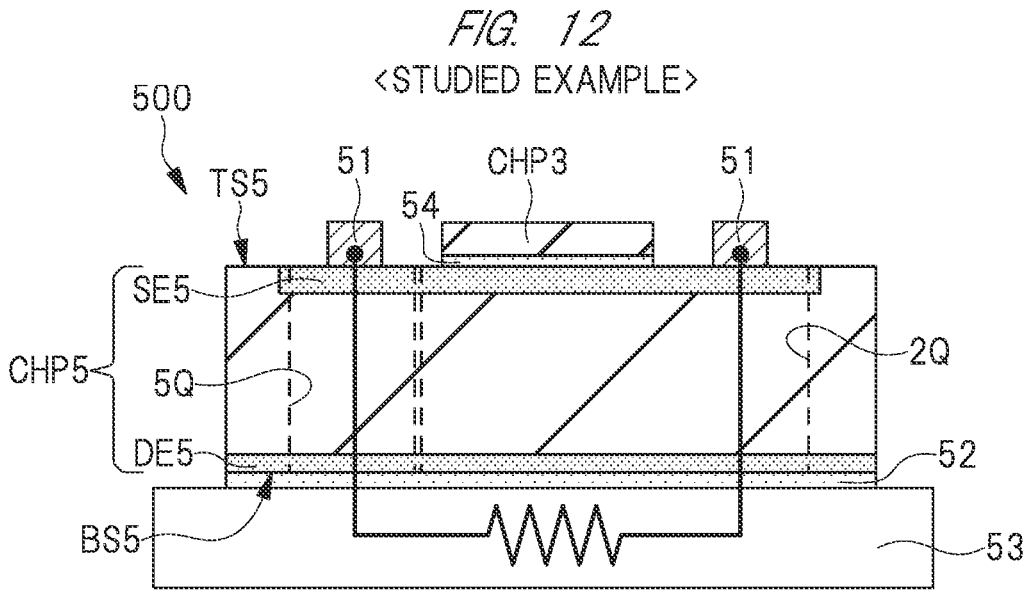
FIG. 12 is a cross-sectional view showing the semiconductor device in the studied example.

FIGS. 11 and 12 show a semiconductor device 500 in a studied example in which the inventors of the present application have studied the case of packaging two n-type MOSFETs disclosed in Patent Document 1 (the third case example).

As shown in FIGS. 11 and 12, a semiconductor chip CHP5 in the studied example includes a MOSFET 5Q of n-type and a MOSFET 2Q of n-type, which are formed on the same semiconductor substrate. On a front surface TS5 of the semiconductor chip CHP5, a source electrode SE5 and a gate wiring GW5 are formed, and on a back surface BS5 of the semiconductor chip CHP5, a drain electrode DE5 is formed.

Referring to the equivalent circuit in FIG. 1, the MOSFET 2Q of n-type corresponds to a main device that serves as a switch in the circuit device. Then, the MOSFET 5Q of n-type corresponds to a device that is applied in place of the MOSFET 1Q of p-type in FIG. 1 and serves for preventing the backflow of the current. A drain of the MOSFET 5Q of n-type is coupled to the drain of the MOSFET 2Q of n-type, whereby such a circuit device that is equivalent to that in FIG. 1 is provided.

The source electrode SE5 and the gate wiring GW5 are directly connected to external connection members 51. The drain electrode DE5 is connected to a lead frame 53 with conductive paste 52 interposed therebetween. The semiconductor chip CHP3 including the control circuit CTRL is provided on the source electrode SE5 with insulating resin 54 interposed therebetween.

In the studied example, the drains of the two MOSFETS 2Q and 5Q are electrically connected to each other with an n-type drift region in the semiconductor substrate, the drain electrode DE5 and the lead frame 53 interposed therebetween. Therefore, there is a problem that it is difficult to reduce a loss of the switch since a resistance component between the two MOSFETs 2Q and 5Q in the transverse direction increases. Accordingly, there is a problem that it is difficult to enhance the performance of the semiconductor device.

Moreover, since the MOSFETs 2Q and 5Q are formed on the same semiconductor substrate, a forming area of each thereof decreases. Particularly, when priority is given to the MOSFET 2Q that is the main device, the forming area of the MOSFET 5Q is prone to decrease. Therefore, there is a problem that it is difficult to reduce the ON-resistance of each of the MOSFETs 2Q and 5Q. Moreover, since a footprint of the external connection members 51 cannot be increased, there is a problem that resistance values related to these are prone to increase.

FIG. 13 is a table in which the semiconductor device 100 according to the first embodiment and the semiconductor device 500 according to the studied example are compared with each other with regard to the respective resistance values. Note that numeric values in FIG. 13 are shown as relative values. Moreover, herein, the above-described numeric values are calculated on the assumption that the forming area of the MOSFET 2*g* according to the first embodiment is approximately the same as a forming area of the MOSFET 2Q according to the studied example.

Generally, in the p-type MOSFET, carrier mobility thereof is lower by approximately three times than that of an n-type MOSFET with the same size. Therefore, the ON-resistance of the MOSFET 1Q of p-type according to the first embodiment increases more than that of the n-type MOSFET with the same size. However, since the semiconductor chip CHP1 including the MOSFET 1Q of p-type is provided separately from the semiconductor chip CHP2, the forming area of the MOSFET 1Q can be increased more than that of the MOSFET 50 according to the studied example. Hence, the ON-resistance of the MOSFET 1Q can be made substantially equivalent to the ON-resistance of the MOSFET 5Q.

Moreover, in the first embodiment, the external connection members 11 and 21 can be provided on the front surface TS1 of the semiconductor chip CHP1 and the front surface TS2 of the semiconductor chip CHP2, respectively, and the lead frame 12 can be provided on the back surface BS1 of the semiconductor chip CHP1. Accordingly, there increase footprints of the external connection members and the lead frame, and it becomes easy to reduce resistance values related to these. Broadly speaking, in the first embodiment, external connection members and a lead frame, which are approximately fourth to fifth times those in the studied example, can be arranged.

Moreover, while the resistance component in the transverse direction is large, for example, in the lead frame 53 in the studied example, the drain electrode DE2 and the source electrode SE1 are in contact with each other in a longitudinal direction with the conductive paste 30 interposed therebetween in the first embodiment. Therefore, a distance between the drain electrode DE2 and the source electrode SE1 is short, and accordingly, a resistance component between the two MOSFETs 1Q and 2Q can be reduced.

Moreover, as described in the BACKGROUND, the first case example and the second case example are present as methods of implementing the semiconductor chip including the n-type MOSFET and the semiconductor chip including the p-type MOSFET. The first case example is a method of preparing two semiconductor chips as two separate packages, and the second case example is a method of laying two semiconductor chips flat in the transverse direction and preparing these as one package.

In the first embodiment, the semiconductor chip CHP1 and the semiconductor chip CHP2 are laminated on each other in the longitudinal direction, and are implemented as one package. Hence, in the first embodiment, in comparison with the first case example and the second case example, the area of the package can be reduced, and the implementation area of the semiconductor module can also be reduced.

Moreover, in the first embodiment, the gate electrode GE1 of the MOSFET 1Q of p-type is electrically fixed to the ground potential. Therefore, the control circuit CTRL does not require a function to switch the MOSFET 1Q between the ON state and the OFF state. Hence, the control circuit CTRL can be simplified, and the semiconductor chip CHP3 including the control circuit CTRL can be miniaturized.

As described above, according to the first embodiment, the implementation area and the area of the package, which are substantially equivalent to those of the studied example (the third case example), can be achieved, and the resistance component can be reduced more than in the studied example, and accordingly, the performance of the semiconductor device 100 can be enhanced. Moreover, the loss of the circuit device using the semiconductor device 100 as a switch can be reduced.

Second Embodiment

Figure 14:
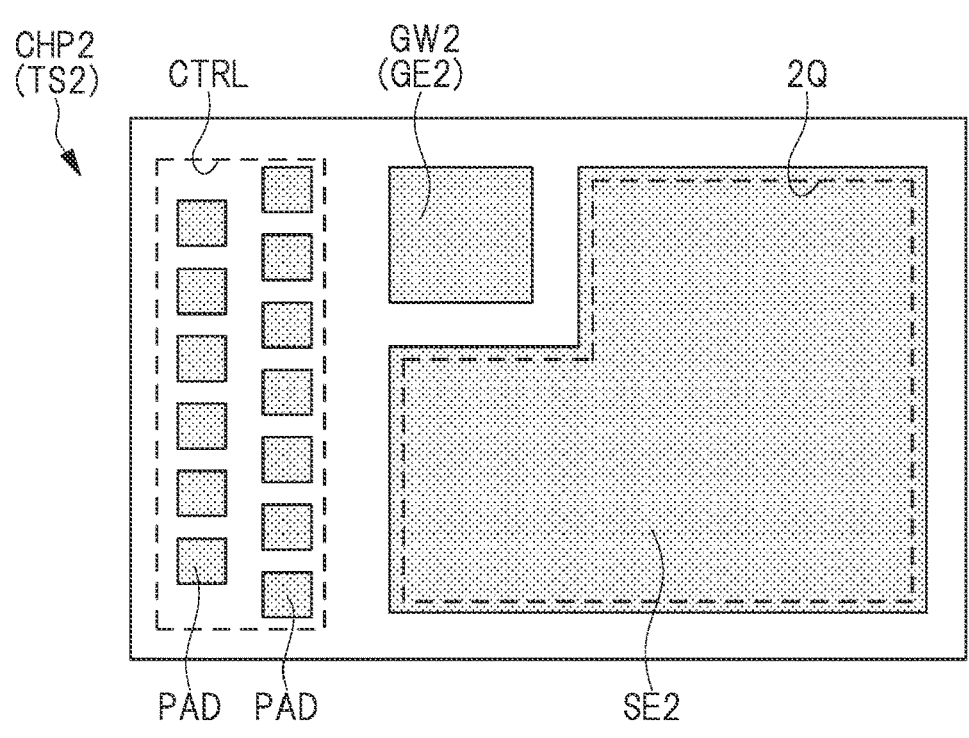
FIG. 14 is a plan view showing the other semiconductor chip in a second embodiment.

A semiconductor device 100 in a second embodiment will be described below with reference to FIGS. 14 and 15. Note that, in the following description, differences from those of the first embodiment will be mainly described, and a description of duplicates with those of the first embodiment will be omitted.

In the first embodiment, the control circuit CTRL is included in the semiconductor chip CHP3. As shown in FIG. 14, in the second embodiment, the control circuit CTRL is included in the semiconductor chip CHP2. Transistors which constitute the control circuit CTRL are formed in a region of the semiconductor substrate SUB2, which is different from the region in which the MOSFET 2Q is formed.

Figure 15:
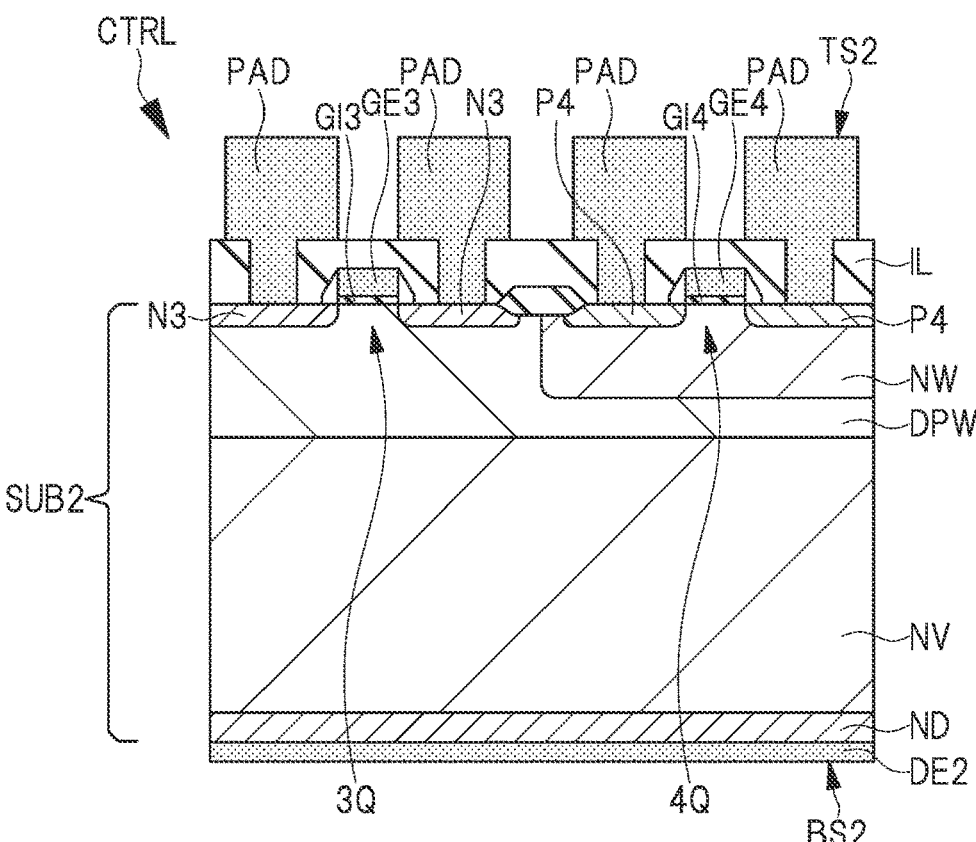
FIG. 15 is a cross-sectional view showing a MOSFET that constitutes a control circuit in the second embodiment.

The transistors which constitute the control circuit CTRL are a MOSFET 3Q of n-type and a MOSFET 4Q of p-type, which are as shown in FIG. 15 for example. Each of the MOSFETs 3Q and 4Q forms a structure of a planar type. In the region in which the MOSFETs 3Q and 4Q are formed, a well region DPW of p-type is formed in the semiconductor substrate SUB2, and the MOSFET 2Q and the MOSFETs 3Q and 4Q are electrically isolated from each other by the well region DPW.

The structure of the MOSFET 3Q will be described. On the well region DPW, a gate electrode GE3 is formed with a gate insulating film GI3 interposed therebetween. In the well region DPW, a diffusion region N3 of n-type is formed. The diffusion region N3 constitutes a source region or drain region of the MOSFET 3Q.

The structure of the MOSFET 4Q will be described. In the well region DPW in which the MOSFET 4Q is formed, a well region NW of n-type is formed. On the well region NW, a gate electrode GE4 is formed with a gate insulating film GI4 interposed therebetween. In the well region NW, a diffusion region P4 of p-type is formed. The diffusion region P4 constitutes a source region or drain region of the MOSFET 4Q.

The MOSFETs 3Q and 4Q are covered with the interlayer insulating film IL, and on the interlayer insulating film IL, a plurality of pad electrodes PADs is formed. The plurality of pad electrodes PADS is electrically connected to the gate electrodes GE3 and GE4 and the diffusion regions N3 and P4. Note that the plurality of pad electrodes PADs is formed in the same manufacturing process as that of the source electrode SE2 and the gate wiring GW2, and are made of the same material as that of the source electrode SE2 and the gate wiring GW2.

A plurality of each of the MOSFETS 30 and 40 is formed, and the MOSFETs 3Q and 4Q constitute a variety of circuits such as a CMOS inverter together with the plurality of pad electrodes PADs. Moreover, though not shown herein, the MOSFETS 3Q and 4Q are electrically connected to other semiconductor chips, wiring boards, electronic instruments or the like with external connection members (bonding wires) interposed therebetween, the external connection members being connected to the plurality of pad electrodes PADS. Therefore, the MOSFETs 3Q and 4Q can be electrically connected to the MOSFETs 1Q and 2Q.

As described above, the control circuit CTRL is built in the semiconductor chip CHP2, whereby it is unnecessary to prepare the semiconductor chip CHP3. Accordingly, the manufacturing of the semiconductor device 100 can be simplified. Note that the control circuit CTRL can be built in the semiconductor chip CHP1 in place of the semiconductor chip CHP2.

While the present invention has been specifically described above on the basis of the above-described embodiments, the present invention is not limited to the above-described embodiments, and is modifiable in various ways within the scope without departing from the spirit thereof.

For example, in the above-described embodiments, the description has been given of the case where the load LAD of the circuit device is an electrical appliance for use in an automobile; however, the circuit device is not limited to be used for an automobile, and the load LAD may be other electrical appliance for use in other than an automobile.

Moreover, the above-described embodiments have been described on the assumption that the semiconductor substrates SUB1 and SUB2 are silicon substrates. However, the material of the semiconductor substrates SUB1 and SUB2 is not limited to silicon, and the semiconductor substrates SUB1 and SUB2 may be silicon carbide substrates (SiC substrates).

Moreover, in the above-described embodiments, the MOSFETs 1Q and 20 adopt the trench gate-type structure. However, the MOSFETs 1Q and 2Q may be of a planar type if the MOSFETs 1Q and 20 have a structure in which the source electrodes SE1 and SE2 and the gate wirings GW1 and GW2 are provided on the surfaces TS1 and TS2 side and the drain electrodes DE1 and DE2 are provided on the back surfaces BS1 and BS2 side. That is, the trenches TR do not have to be formed, and the gate electrodes GE1 and GE2 may be formed on the semiconductor substrates SUB1 and SUB2 with the gate insulating interposed therebetween.

What is claimed is:
1. A semiconductor device comprising:
a first semiconductor chip including a first MOSFET of p-type and a first parasitic diode formed in the first MOSFET; and
a second semiconductor chip including a second MOSFET of n-type and a second parasitic diode formed in the second MOSFET,
wherein a first source electrode and a first gate wiring are formed on a front surface of the first semiconductor chip,
wherein a first drain electrode is formed on a back surface of the first semiconductor chip, wherein a first anode of the first parasitic diode is coupled to the first drain electrode, and a first cathode of the first parasitic diode is coupled to the first source electrode, wherein a second source electrode and a second gate wiring are formed on a front surface of the second semiconductor chip, wherein a second drain electrode is formed on a back surface of the second semiconductor chip, wherein a second anode of the second parasitic diode is coupled to the second source electrode, and a second cathode of the second parasitic diode is coupled to the second drain electrode, wherein the back surface of the second semiconductor chip and the front surface of the first semiconductor chip face each other such that the second drain electrode and the first source electrode come into contact with each other via a conductive member, and wherein the first gate wiring is directly and electrically fixed to a ground potential.

2. The semiconductor device according to claim 1, further comprising a third semiconductor chip including a control circuit electrically connected to the second gate wiring, wherein the control circuit has a function to supply a gate potential to the second gate wiring in order to switch the second MOSFET between an ON state and an OFF state.

3. The semiconductor device according to claim 1, wherein the second semiconductor chip further includes a control circuit electrically connected to the second gate wiring, and wherein the control circuit has a function to supply a gate potential to the second gate wiring in order to switch the second MOSFET between an ON state and an OFF state.

4. The semiconductor device according to claim 1, wherein the first semiconductor chip includes:

a first semiconductor substrate of p-type having a front surface and a back surface;

a first body region of n-type formed in the first semiconductor substrate at a position located closer to the front surface of the first semiconductor substrate than the back surface of the first semiconductor substrate;

a first source region of p-type formed in the first body region;

a first trench formed in the first semiconductor substrate as a position located closer to the front surface of the first semiconductor substrate than the back surface of the first semiconductor substrate so that a bottom of the first trench is located below the first body region;

a first gate insulating film formed inside the first trench;

a first gate electrode formed on the first gate insulating film so as to fill an inside of the first trench;

a first interlayer insulating film formed on the front surface of the first semiconductor substrate;

the first source electrode formed on the first interlayer insulating film and electrically connected to the first body region and the first source region;

the first gate wiring formed on the first interlayer insulating film and electrically connected to the first gate electrode;

a first drain region of p-type formed in the first semiconductor substrate at a position located closer to the back surface of the first semiconductor substrate than the front surface of the first semiconductor substrate; and the first drain electrode formed under the back surface of the first semiconductor substrate and electrically connected to the first drain region, wherein the second semiconductor chip includes:

a second semiconductor substrate of n-type having a front surface and a back surface;

a second body region of p-type formed in the second semiconductor substrate at a position located closer to the front surface of the second semiconductor substrate than the back surface of the second semiconductor substrate;

a second source region of n-type formed in the second body region;

a second trench formed in the second semiconductor substrate at a position located closer to the front surface of the second semiconductor substrate than the back surface of the second semiconductor substrate so that a bottom of the second trench is located below the second body region;

a second gate insulating film formed inside the second trench;

a second gate electrode formed on the second gate insulating film so as to fill an inside of the second trench;

a second interlayer insulating film formed on the front surface of the second semiconductor substrate;

the second source electrode formed on the second interlayer insulating film and electrically connected to the second body region and the second source region;

the second gate wiring formed on the second interlayer insulating film and electrically connected to the second gate electrode;

a second drain region of n-type formed in the second semiconductor substrate at a position located closer to the back surface of the second semiconductor substrate than the front surface of the second semiconductor substrate; and the second drain electrode formed under the back surface of the second semiconductor substrate and electrically connected to the second drain region, wherein the first parasitic diode is composed of the first body region, and of the first semiconductor substrate and the first drain region which are located below the first body region, and wherein the second parasitic diode is composed of the second body region, and of the second semiconductor substrate and the second drain region which are located below the second body region.

5. The semiconductor device according to claim 4, wherein the second semiconductor chip further includes a p-type column region formed in the second semiconductor substrate located below the second body region.

6. A circuit device using the semiconductor device according to claim 1 as a switch, comprising:

a battery having a positive electrode and a negative electrode; and a load, wherein the first drain electrode is electrically connected to the positive electrode, and wherein the second source electrode is electrically connected to the negative electrode via the load.

* * * * *